US011611271B2

(12) United States Patent
Stanek et al.

(10) Patent No.: US 11,611,271 B2
(45) Date of Patent: Mar. 21, 2023

(54) ELECTRIC MACHINE WITH AN ADJUSTABLE AIR GAP

(71) Applicant: Rolls-Royce Deutschland Ltd & Co KG, Blankenfelde-Mahlow (DE)

(72) Inventors: Christian Stanek, Marquartstein (DE); Dieter Cramer, Munich (DE)

(73) Assignee: Rolls-Royce Deutschland Ltd & Co KG, Blankenfelde-Mahlow (DE)

(*) Notice: Subject to any disclaimer, the term of this patent is extended or adjusted under 35 U.S.C. 154(b) by 254 days.

(21) Appl. No.: 17/030,307

(22) Filed: Sep. 23, 2020

(65) Prior Publication Data
US 2021/0091646 A1    Mar. 25, 2021

(30) Foreign Application Priority Data

Sep. 24, 2019  (DE) ................... 10 2019 214 519.1

(51) Int. Cl.
*H02K 21/02*   (2006.01)
*H02K 1/18*    (2006.01)
*H02K 1/276*   (2022.01)
*H02K 1/16*    (2006.01)
*H02K 7/04*    (2006.01)
*H02K 11/215*  (2016.01)
*G01R 33/07*   (2006.01)
*H02P 6/16*    (2016.01)

(52) U.S. Cl.
CPC ......... *H02K 21/026* (2013.01); *G01R 33/072* (2013.01); *H02K 1/16* (2013.01); *H02K 1/182* (2013.01); *H02K 1/276* (2013.01); *H02K 7/04* (2013.01); *H02K 11/215* (2016.01); *H02P 6/16* (2013.01); *H02K 2201/03* (2013.01)

(58) Field of Classification Search
CPC ...... H02K 21/026; H02K 11/215; H02K 1/16; H02K 7/04
USPC .............................. 310/90, 311, 318, 323.05
See application file for complete search history.

(56) References Cited

FOREIGN PATENT DOCUMENTS

CN           102223106 A  * 10/2011

* cited by examiner

*Primary Examiner* — Jose A Gonzalez Quinones
(74) *Attorney, Agent, or Firm* — Lempia Summerfield Katz LLC (57) ABSTRACT

An electric machine includes a rotor, a stator, and an air gap formed between a magnetic device of the rotor and the stator. For the selective setting of the air gap, movement devices implemented by piezoelectric stacks are provided on the rotor and/or on the stator. The movement devices may influence radial positions of the respective magnetic device and thus set the radial air gap width. It is thereby possible to exert open-loop and/or closed-loop control over a power or torque of the electric machine without adjusting stator currents. Vibration or unbalance of the rotor may also be counteracted quickly and effectively during operation of the machine.

19 Claims, 5 Drawing Sheets

ELECTRIC MACHINE WITH AN ADJUSTABLE AIR GAP

This application claims the benefit of German Patent Application No. DE 10 2019 214 519.1, filed Sep. 24, 2019, which is hereby incorporated by reference in its entirety.

BACKGROUND

The present embodiments relate to an electric machine that has an adjustable air gap.

A radial distance between a rotor and a stator of an electric machine plays a role in several respects during the operation of the machine. A magnetic flux density and thus the power and torque of an electric machine are heavily dependent on the distance between magnetic devices on the rotor and the stator (e.g., on the "air gap width"). Any variations in the air gap width during the operation of the machine (e.g., owing to the high centrifugal forces on the circumference of the rotor on which the permanent magnets are arranged, and/or owing to temperature effects) lead to corresponding irregularities in the power of the machine. There may be contact between the stator and the rotor in the event of vibration or oscillation or unbalance of the rotor, and this may result in considerable damage to the machine.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an electric machine and a method that control a radial distance between a rotor and a stator are provided.

The electric machine has a first cylindrical component (e.g., a rotor) having first magnetic means (e.g., first magnetic devices such as permanent magnets) and a second cylindrical component (e.g., a stator) having second magnetic means (e.g., second magnetic devices such as stator windings). The cylindrical components are arranged concentrically with one another such that an air gap is formed between the first magnetic means and the second magnetic means. In the operating state of the electric machine, the components rotate relative to one another around a common axis, and the respective magnetic means interact electromagnetically with one another. The machine is thus enabled to be used either as an electric motor or as a generator. Provided on at least one of the components are movement devices that may be controlled by a control unit and are arranged in a manner distributed along the circumferential direction of the respective component such that, in an actuating mode, the movement devices may be used to selectively influence the radial air gap width in an angularly resolved manner (e.g., locally at the points or angles at which movement devices are arranged).

The "radial air gap width" may be the extent of the air gap in the radial direction. The term "in an angularly resolved manner" provides that the radial air gap width cannot necessarily be set uniformly over the entire air gap but that different air gap widths may be set locally at different angular positions in relation to the axis of rotation.

Each of the movement devices is associated with one group of magnetic devices of the component equipped with the movement devices. A respective group includes at least one of these magnetic devices but may also include a plurality of adjacent examples of these magnetic devices. Each movement device is arranged on this component such that the movement device may act on the group associated with this movement device and hence on each of the magnetic devices of this group. The radial position thereof and hence the radial air gap width may thus be selectively influenced.

The association of groups of magnetic devices with movement devices is unambiguous (e.g., none of the groups is associated with two different movement devices).

In extreme cases, each movement device is associated with precisely one magnetic device (e.g., each of the groups includes precisely one magnetic device), whereby the maximum possible resolution and controllability is then achieved. However, in other embodiments, the groups may each include a plurality of magnetic devices that may then be arranged adjacent to one another and may be moved jointly. In another embodiment, not all the groups on the component equipped with movement devices may be associated with one movement device, but only every second group, for example. It is then logically impossible for these unassociated groups or groups that are not provided with movement devices to be moved.

One component equipped with movement devices may be a rotor of the electric machine. Another of the components equipped with movement devices may be a stator of the electric machine.

In the case of the rotor, the movement devices are arranged in such a way on the rotor, between a rotor main body of the rotor and the magnetic means of the rotor (e.g., permanent magnets), that a respective movement device may act on each magnetic device associated with this movement device, thus enabling the radial position thereof and hence the radial air gap width to be selectively influenced.

For example, the rotor may have, on a circumference facing the stator, magnet poles with receiving regions for the magnetic device(s) of the rotor. In the case where the rotor is to be equipped with movement devices, it is possible, in a first embodiment, for at least some of the magnet poles to have a cavity that is arranged below the respective receiving region when viewed in the radial direction. In each of the cavities, one of the movement devices is arranged such that, in the actuating mode, the one movement device may influence the radial position of the respective receiving region and thus of the magnetic device of the rotor, in each case by applying a force acting in the radial direction, since, for example, a radial extension of the magnet pole is brought about by the applied radial force. In an alternative embodiment, at least some of the magnet poles may have a respective movement device that includes an actuator and a force deflecting device. The respective movement device is arranged such that, in the actuating mode, the actuator applies a force acting in the axial direction, and the force deflecting device deflects the axial force into a radial force. By this, ultimately, the radial position of the respective receiving region and thus of the magnetic device(s) of the rotor may be influenced, since, for example, a radial extension of the magnet pole is brought about by the applied radial force.

In the case of the stator, the movement devices are arranged in such a way on the stator that a respective movement device may act on each magnetic device associated with this movement device, thus enabling the radial position thereof and hence the radial air gap width to be selectively influenced.

The stator has, on a circumference of the stator facing the rotor, stator teeth that each have a tooth head facing the rotor, a tooth root facing away from the rotor, and a tooth neck arranged between the tooth head and the tooth root. In the case where the stator is equipped with movement devices, at least some of the stator teeth in each case have a cavity that is arranged in the region of the tooth neck. One of the movement devices is arranged in each of the cavities in such a way that, in the actuating mode, the respective movement device may influence the radial position of the respective tooth head, in each case by applying a force acting in the radial direction. This is the case since, for example, a radial extension of the stator tooth is brought about by the applied radial force.

The control unit may be configured for an actuating mode in order to supply the movement devices selectively with electric signals in order to selectively set radial extensions of the movement devices to influence the radial air gap width.

The control unit may also be configured for a sensing mode in order to operate the movement devices and, in the process, to pick off electric time signals at the movement devices and evaluate the signals in order therefrom to determine the rotational position of the rotor and/or the radial air gap width in an angularly resolved manner (e.g., locally at the points or angles at which movement devices are arranged). The radial air gap width is determined in a consistent way at a number of different angular positions.

For the angularly resolved determination of the radial air gap width, a separate measuring device may be provided in addition or as an alternative to determination with the aid of the time signals that may be picked off at the movement devices.

The separate measuring device may, for example, have a number of magnetic field sensors (e.g., Hall-effect sensors) that are arranged in a manner distributed in the circumferential direction along the air gap for angularly resolved magnetic field measurement. The control unit is then configured to determine the respective radial air gap widths at the locations of the respective magnetic field sensors from the magnetic fields measured by the magnetic field sensors.

The control unit may also be configured to operate the movement devices such that, in the case where a state of deviation (e.g., a vibration or oscillation of the rotor and/or a deviation of the radial air gap width from a setpoint) is detected during the angularly resolved determination of the radial air gap width (e.g., to operate the movement devices in actuating mode in a manner corresponding to damping), the state of deviation is counteracted and a desired radial air gap width is achieved instead (e.g., by increasing the radial air gap width at certain angular positions and/or decreasing the radial air gap width at other angular positions, depending on requirements). In this case, a switch is made briefly from the sensing mode to the actuating mode in a consistent manner.

The control unit is also configured to use the determined rotational position of the rotor for the general closed-loop and/or open-loop control of the electric machine (e.g., also independently of the influencing of the air gap width). It is known that synchronization of the machine is beneficial to efficiency. For this purpose, an exact knowledge of the rotational position of the rotor relative to the stator is to be provided.

In one embodiment, the movement devices each have an actuator that includes a piezoelectric stack including at least one piezoelectric element, where the respective piezoelectric stack is connected electrically to the control unit for the movement devices. In one embodiment, in the actuating mode, an extent of the actuator may be set selectively based on an electric voltage applied by the control unit. In the sensing mode, an electric voltage dependent on the extent of the actuator may be picked off. The use of piezoelectric elements provides the advantage that the piezoelectric elements may develop a rapid and large force effect while being of compact construction. Since the rotor and/or the stator are/is composed of a material that, by its very nature, has only little elasticity, actuators that may generate large forces are to be provided. Further, since the periods of time in which there may be a need to respond to certain situations using the actuators are short owing to the high speeds of rotation in electric machines, actuators that may be activated quickly are be employed. Both may be served by piezoelectric elements.

In a method for operating an electric machine of this kind, therefore, the movement devices are used in an actuating mode in order to selectively influence the radial air gap width in an angularly resolved manner in an actuating mode.

In a sensing mode, electric time signals are picked off at the movement devices in order to determine the rotational position of the rotor therefrom. These may be used to exercise closed-loop and/or open-loop control over the machine or to synchronize the machine and/or to determine the radial air gap width in an angularly resolved manner.

The radial air gap width may be determined in an angularly resolved manner from a number of measured values. For this purpose, the electric time signals picked off at the movement devices in a sensing mode may be used as measured values. As an alternative or in addition, suitable measured values may come from a separate measuring device that has a number of magnetic field sensors (e.g., Hall-effect sensors) that are arranged in a manner distributed in the circumferential direction along the air gap for angularly resolved magnetic field measurement, where the measured values for the determination of the radial air gap width then correspond to the magnetic fields measured by the magnetic field sensors.

In the case where a state of deviation (e.g., a vibration or oscillation of the rotor and/or a deviation of the radial air gap width from a setpoint) is detected during the angularly resolved determination of the radial air gap width, the movement devices are operated such that, in an actuating mode, the state of deviation is counteracted, and instead, a desired radial air gap width is achieved. This is therefore also equivalent, for example, to damping, which may be necessary in the case of vibration or oscillation of the rotor.

Apart from the generally achievable adjustability of the power or torque of the machine and the improved efficiency associated therewith, the adjustability of the air gap also has an advantageous effect in the manufacturing process of the machine (e.g., during the joining of the stator and the rotor).

Further advantages and embodiments can be found in the drawings and the corresponding description.

In the text that follows, the invention and exemplary embodiments are explained in more detail with reference to drawings. There, the same components are identified by the same designations in various figures. It is therefore possible that, when a second figure is being described, no detailed explanation will be given of a specific designation that has already been explained in relation to another, first figure. In such a case, it may be assumed for the embodiment of the second figure that, even without detailed explanation in relation to the second figure, the component identified there by this designation has the same properties and functionalities as explained in relation to the first figure. Further, for the sake of clarity, in some cases, not all the designations are

DETAILED DESCRIPTION

Terms such as "axial", "radial", "tangential", etc. relate to an axis used in the respective figure or in the example described in each case. In other words, the directions axially, radially, and tangentially always relate to an axis of rotation of a rotor and hence to a corresponding axis of symmetry of a stator. "Axial" herein describes a direction parallel to the axis, "radial" describes a direction orthogonal to the axis, toward or away from the axis, and "tangential" is a direction that is directed in a circle around the axis at a constant radial spacing from the axis and with a constant axial position. The expression "in the circumferential direction" is equivalent to "tangential."

In connection with components (e.g., coils or stator teeth), the term "adjacent" is intended to express the fact that, in the case of "adjacent components," there is, for example, no further such component between these two components but at most an empty intermediate space.

The expression "coaxial components" (e.g., coaxial components such as the rotor and the stator) may be components that have same normal vectors, for which, therefore, the planes defined by the coaxial components are parallel to one another. Further, the expression is intended to entail that the centers of coaxial components lie on a same axis of rotation or symmetry. However, these centers may lie in different axial positions on this axis, and therefore, the planes may be at a mutual spacing >0. The expression does not necessarily require that coaxial components have a same radius.

For the sake of clarity, it is often the case that, in some of the figures, in cases in which components are present in multiple instances, not all the components illustrated are provided with reference signs. This applies especially to the reference signs 112, 113, 121, 122, 160, 161, 170.

Figure 1:
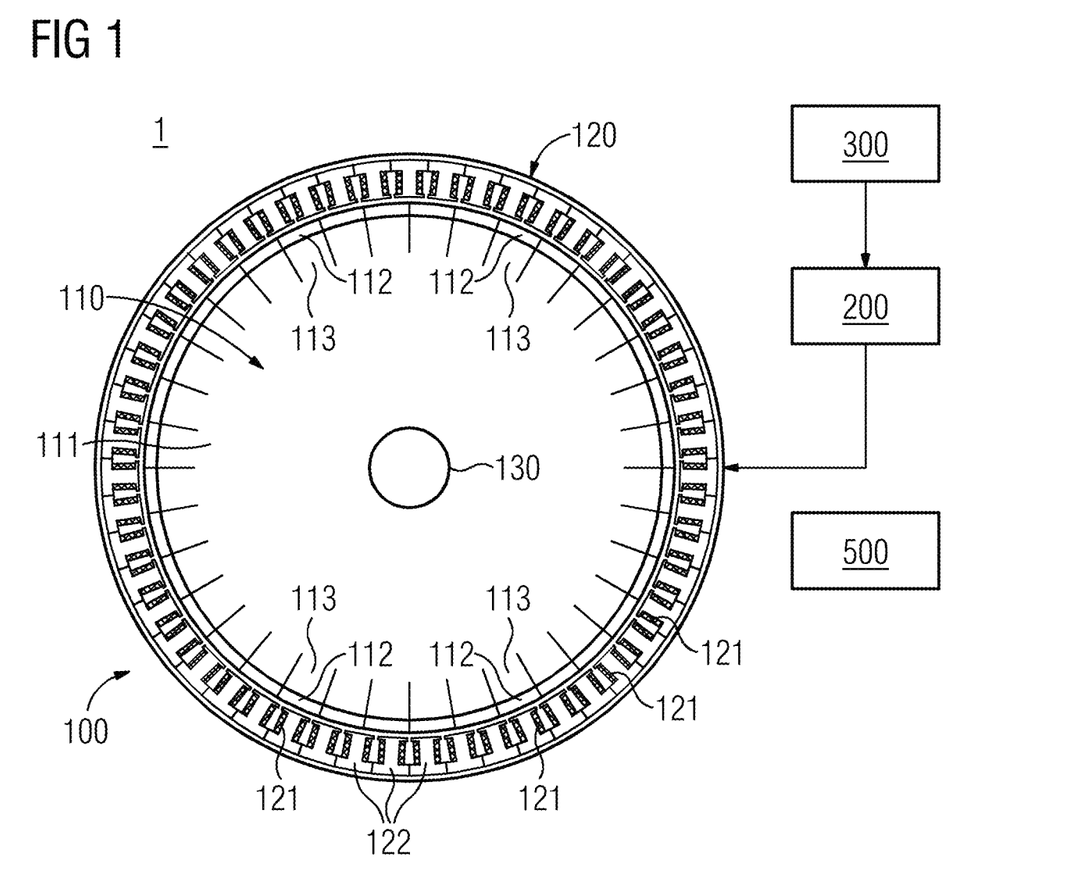
FIG. 1 shows a known electric machine.

FIG. 1 shows in greatly simplified form a system 1 or drive system of an electric airplane having an electric machine 100 of the kind known in the prior art configured, by way of example, as an electric motor. The electric machine 100, in a similar construction, may also be operated as a generator. The construction of the machine 100 described below is greatly simplified and serves merely to illustrate the basic operation of the electric motor or electric machine. Details, for example, of the stator teeth 122 or permanent magnets 112 to be explained are shown in the following figures (e.g., these and also other components are illustrated substantially only in simplified form in FIG. 1). It may be assumed to be known that the various components of the machine 100 may be arranged differently, depending on whether the electric machine 100 is configured as a generator or as an electric motor and/or as, for example, a radial-flow or axial-flow machine with a rotor configured as an internal or external rotor, etc.

The electric motor 100 has a substantially annular or hollow-cylindrical stator 120 and a substantially cylindrical rotor 110 (e.g., formed as an internal rotor). The rotor 110 is arranged within the stator 120 and concentrically therewith and, in the operating state of the electric motor 100, rotating about an axis of rotation. The rotor 110, or a corresponding substantially cylindrical rotor main body 111, respectively, is connected to a shaft 130 for conjoint rotation therewith, so that a rotation of the rotor 110 may be transmitted via the shaft 130 to a component to be driven (not illustrated) (e.g., to a propeller of an airplane).

The stator 120 has a first magnetic device 121 that may be implemented, for example, as windings 121 of a stator winding system. Each of the windings 121 has been wound onto a respective stator tooth 122 of the stator 120 and, in the operating state of the electric motor 100, is flowed through by an electric current, so that magnetic fields are generated. At magnet poles 113, the rotor 110 has a second magnetic device 112 configured as permanent magnets 112, for example, and may be arranged on a surface of the rotor main body 111 facing the stator 120.

The first magnetic device 121 and the second magnetic device 112 are configured and spaced apart from one another by an air gap 150 such that the first magnetic device 121 and the second magnetic device 112 in the operating state of the electric motor 100 interact electromagnetically with one another. This concept, including the conditions for the formation and precise arrangement of the first magnetic device 121 and the second magnetic device 112 or of the rotor 110 and the stator 120, are known and are therefore not explained in more detail in the text that follows. In order to operate the electric machine 100 as an electric motor, the stator winding system or the windings 121 thereof are supplied with electric currents with the aid of a power source 200, 300. Electric currents cause the windings 121 to generate corresponding magnetic fields that come to interact electromagnetically with the magnetic fields of the permanent magnets 112 of the rotor 110. This results in a torque acting in a tangential direction or circumferential direction on the permanent magnets 112 that, provided that the permanent magnets 112 are connected sufficiently firmly to the rotor main body 111, results in the rotor 110 and conjointly therewith the shaft 130 being set in rotation when the components are suitably configured and disposed in relation to one another.

The power source 200, 300 includes an electric energy source 300 (e.g., a battery or an electric generator), and power electronics 200 that convert the electric energy made available by the energy source 300 into the current/voltage signal instantaneously required by the electric motor 100 to produce the power demanded (e.g., by an operator of the system 1). The system 1 is subject to open-loop and/or closed-loop control by a control system 500 in accordance with inputs by an operator of the system 1. Depending on the use of the system 1, the operator of the system 1 may be a pilot or a driver. Depending on the degree of automation, however, the operator may also be a higher-level monitoring, open-loop control, and/or closed-loop control system of the system (e.g., if the system 1 does not form a drive system but forms an industrial plant having an electric machine 100 of this kind).

This concept of forming the electric machine 100 as an electric motor may be assumed to be known. The corresponding configuration and use of the electric machine 100 as a generator may also be assumed to be known. In this operating mode, the component 300 in FIG. 1 may, for example, be understood as a load (e.g., once again, as a rechargeable battery and/or as an electric motor). A current/voltage signal supplied by the generator 100 is converted by the power electronics 200 into a current/voltage signal that may be processed by the load. On account of the familiarity of the concepts, the two forms of the electric machine 100 are not detailed any further in the text that follows.

The power or torque that may be achieved with the electric machine 100 depends greatly on the air gap width (e.g., on the radial extent of the air gap 150 and thus ultimately on the spacing between the first magnetic device 121 and the second magnetic device 112). Forces in the air gap 150 rise disproportionately as the extent decreases. Accordingly, an air gap 150 that is as small as possible may be the aim; it is, however, also to be taken into account that vibration may occur during the operation of the electric machine 100, and therefore, as the air gap 150 becomes smaller, there is an increasing risk that the rotor 110 and the stator 120 or magnetic devices 112, 121 will come into contact with one another.

Figure 2:
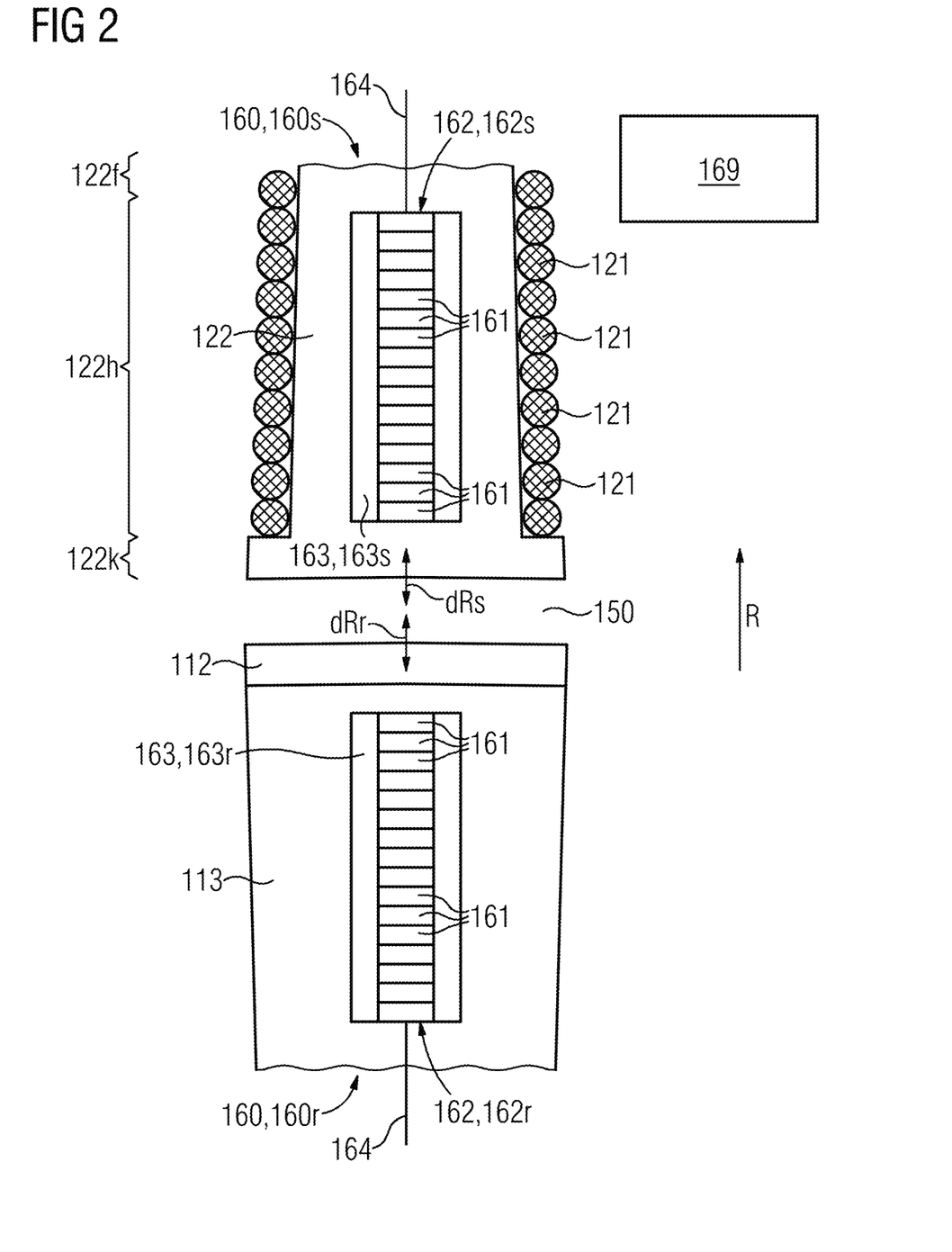
FIG. 2 shows a first embodiment of a movement device.

In order to be able to influence the air gap width, the machine 100 is equipped with movement devices 160 that may be subject to open-loop and/or closed-loop control. This is illustrated by way of example in an axial direction of view in FIG. 2. There, a stator pole or stator tooth 122 with the winding 121 wound thereon, as well as a magnet pole 113 of the rotor 110 with a permanent magnet 112, are in each case shown. Though not separately illustrated, although the concept in FIG. 2 is demonstrated only by a respective first magnetic device 121 and second magnetic device 112 for the sake of clarity it is possible, depending on requirements, for example, for all the magnetic devices 112, 121 or even just some of the magnetic devices 112, 121 to be equipped with movement devices 160. As a result, in such a case, the movement devices 160 are arranged along a circumferential direction of the rotor 110 or the stator 120 (e.g., in a uniformly distributed manner). In the embodiment illustrated in FIG. 2, both the rotor 110 and the stator 120 have movement devices 160. However, though likewise not illustrated separately, only the rotor 110 or, alternatively, only the stator 120 may be equipped with movement devices 160.

An appended "s" may be added below to the reference signs of the movement devices 160 or the constituent parts thereof if the explicit intention is to address the movement device 160s of the stator 120 or the constituent parts thereof, and an appended "r" may be added if the movement device 160r of the rotor 110 or the constituent parts thereof is explicitly intended. However, the general modes of operation are the same, and therefore, the respective general, unexpanded reference sign will often be used.

In the embodiment explained here, the movement devices 160 each have a piezoelectric stack 162 constructed from one or more piezoelectric elements 161, where only a few piezoelectric elements 161 are provided with reference signs in FIG. 2. The piezoelectric stacks 162 may be integrated into the poles 122, 113 of the stator 120 and the rotor 110, respectively, and, for this purpose, may be arranged in respective cavities 163 or 163s, 163r that, in the case of the stator 120, are situated in the stator tooth 122 and, in the case of the rotor 110, are situated in the magnet pole 113. The poles 122, 113 are to be dimensioned such that pole cross sections that remain after the subtraction of the cavities 163 may guide the magnetic fluxes required to operate the machine 100. Consistent with this, the restriction also affects the dimensioning of the piezoelectric stacks 162.

The movement devices 160 and, for example, the piezoelectric stacks 162 are connected electrically to a control unit 169 (e.g., a controller) via a respective connection 164, thus enabling electric signals to be transmitted between the respective piezoelectric stack 162 and the control unit 169. In the case where the movement devices 160 are mounted on the rotor 110, the connection 164 may run via the shaft 130, for example. In an actuating operating mode, a change in the radial extent of the piezoelectric stack 162 may be brought about by subjecting the piezoelectric stack 162 to an electric voltage. Conversely, in a sensing operating mode, it is possible to infer the radial extent of the piezoelectric stack 162 by measuring the voltage that may be picked off at the piezoelectric stack 162. The control unit 169 is connected to the control system 500 of the system 1 or integrated into the system.

In the actuating operating mode, the air gap width may be selectively influenced by the movement devices 160. By virtue of the fact that a plurality of movement devices 160 arranged in a manner distributed in the circumferential direction is provided, air gap widths may be set individually at different angular positions.

In the case of the rotor 110, subjecting the piezoelectric stack 162 or 162r, arranged in the cavity 163 or 163r, of the movement device 160 or 160r situated there to an increased electric voltage leads to an extension of the piezoelectric stack 162r in the radial direction R; with reference to the example of the rotor 110 or permanent magnet 112, this leads to the permanent magnet 112 being moved toward the stator 120. This results in the air gap 150 becoming narrower. Conversely, reducing the applied electric voltage enables the radial extent of the piezoelectric stack 162r to be reduced, leading to the permanent magnet 112 moving away from the stator 120.

In the case of the stator 120, the movement device 160 or 160s situated there operates in the same way (e.g., subjecting the piezoelectric stack 162 or 162s to a higher electric voltage leads to an extension of the piezoelectric stack 162s in the radial direction R, toward the rotor 110). The stator tooth 122 has a tooth head 122k facing the rotor 110, a tooth root 122f facing away from the rotor 110, and a tooth neck 122h arranged between the tooth head 122k and the tooth root 122f, where the cavity 163 or 163s with the piezoelectric stack 162s is positioned in the region of the tooth neck 122h. The extension of the piezoelectric stack 162s has the effect that, for example, the tooth head 122k carrying the magnetic flux moves toward the rotor 110, with the result that the air gap 150 becomes narrower. Conversely, it is possible here too, by reducing the applied electric voltage, to reduce the radial extent of the piezoelectric stack 162s, leading to the tooth head 122k moving away from the rotor 120.

The possibility of achieving a reduction in the respective radial extents of the piezoelectric stacks 162r and 162s by reducing the respectively applied voltage both in the case of the rotor 110 and in the case of the stator 120 makes it possible in a first scenario to increase the air gap width. It is accordingly possible either to increase or reduce the air gap 150 with the aid of the movement devices 160 and under open-loop or, where applicable, closed-loop control by the control unit 169. This is equivalent to the power or torque of the electric machine 100 being adjustable without the need to change the currents in the windings 121 of the stator winding system. In a second scenario, the ability to increase the air gap 150 in the radial direction, for example, creates the possibility of preventing mutual contact between the rotor 110 and the stator 120 (e.g., in the case where vibration occurs during the operation of the electric machine 100).

The directions of movement of the permanent magnet 112 or tooth head 122k that are ultimately correspondingly possible are indicated by the arrows dRr, dRs.

Figure 3:
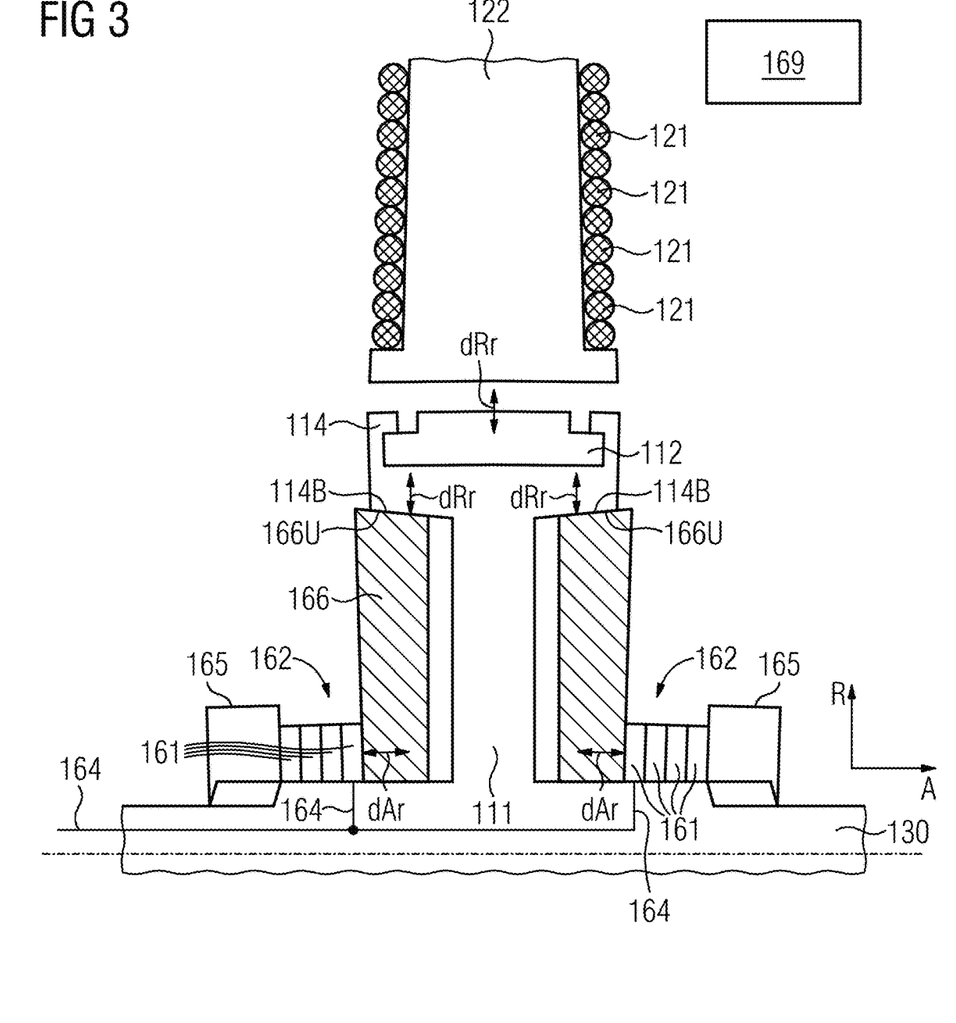
FIG. 3 shows a second embodiment of the movement device.

An alternative configuration of the movement device 160 is demonstrated in FIG. 3 with reference to the example of the rotor 110. Here too, for the sake of clarity, the concept has been illustrated only for a single magnetic device 112 or a single permanent magnet 112. However, the concept may readily be used for each of the magnetic devices 112.

FIG. 3 shows another embodiment in a direction of view in the circumferential direction. In this case, the movement device 160 has two piezoelectric stacks 162 that are once again composed of piezoelectric elements 161 and are connected electrically to the control unit 169. Subjecting the piezoelectric stacks 162 to increased electric voltage leads to expansion of the piezoelectric stacks 162 in the axial direction. The piezoelectric stacks 162 are each supported at one end on fixed steps 165, which are, for example, immovable in the axial direction. Accordingly, the axial extension of the piezoelectric stacks 162 acts on disks 166 positioned there in the respective direction away from the steps 165 and toward the rotor main body 111. These disks extend away from the shaft 130 in the radial direction R and are arranged so as to be movable in the axial direction A, with the result that the forces exerted on the disks 166 by the piezoelectric stacks 162 during their extension lead to the disks 166 being moved in a direction away from the respective step 165 and toward the rotor main body 111. Correspondingly, for the case where the applied voltage is reduced, the disks 166 are moved in a direction away from the rotor main body 111. The axial directions of movement of the disks 166 that are ultimately correspondingly possible are indicated by the arrows dAr.

The disks 166 have a certain thickness and are beveled at the circumference thereof. The disks are in contact at a circumference 166U with a holder 114 of the rotor 110, on which the permanent magnets 112 are fixed.

In the regions 114B that are in contact with the circumferences 166U of the two disks 166, the holder 114 is likewise beveled in the same way as the respective circumference 116U. The axial movement dAr of the disks 166 in the axial direction A therefore has the effect that the disks 166 slide by the respective circumference 166U on the regions 114B of the holder 114, where, owing to the bevels, a radial force effect, and thus a radial movement dRr, is produced on the holder 114 and thus ultimately on the permanent magnet 112.

Consequently, the disks 166 with beveled circumferences 166U, which are additional features in comparison with the first embodiment in FIG. 2, in conjunction with the likewise correspondingly beveled holder 114 act as a force deflector.

In general, it is the case in both embodiments that the single movement devices 160 may be controlled individually by the control unit 169. This has the consequence that, in the actuating mode, the air gap widths at those locations or angular positions at which movement devices 160 are provided may be adjusted locally and individually. In this context, the terms "local" and "individual" provide that the air gap 150 may be influenced not only as a whole but also at selected angular positions. As already indicated, a respective movement device 160 may be provided for each of the magnetic devices 112, 121 of the machine 100, and therefore, a maximum angular resolution of the air gap adjustment is achieved. If a respective movement device is provided only for each second of the magnetic means 112 or 121, for example, when viewed in the circumferential direction, the angular resolution of the air gap adjustment is halved with respect to the maximum possible angular resolution.

In the sensing mode, likewise in both embodiments, no voltages are applied to the piezoelectric stacks 162 on the part of the control unit 169; instead, the voltages that may be picked off at the piezoelectric stacks 162 are measured. Here too, it is the case that the individual movement devices 160 may be read out individually. From this, it is possible to determine the instantaneous radial extent of the respective piezoelectric stack 162 and thereby to obtain an indication of the air gap width at the location of the relevant movement device 160. These air gap widths at various locations or angles of the air gap 150 may be measured with relatively high accuracy by magnetic field sensors 170 or Hall-effect sensors. In this case, the magnetic flux densities are determined at the various locations, and the air gap widths at these locations are inferred therefrom.

Figure 4:
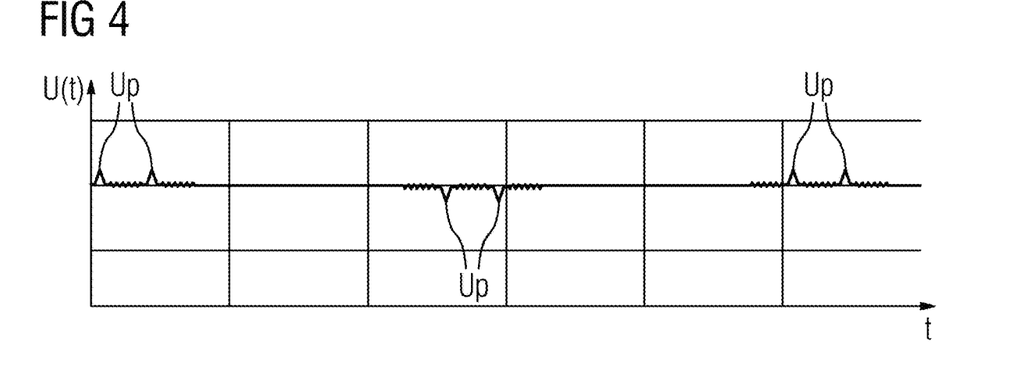
FIG. 4 shows an electric time signal.

The sensing mode may be used to determine the rotational position of the rotor 110 or of the stator 120. For this purpose, the time behavior U(t) of the voltage picked off at any movement device 160 is observed; this is illustrated by way of example in FIG. 4. FIG. 4 shows that the time signal U(t) at various points in time, which are typically repeated at regular intervals, has positive and negative peaks Up, which indicate the point in time at which a permanent magnet 112 of the rotor 110 passes the selected movement device 160. By this, it is accordingly possible to determine the rotational position of the rotor relative to the stator 120. This rotational position is communicated to the control system 500, which may accordingly exercise open-loop and/or closed-loop control over or synchronize the operation of the electric machine and may thus improve the efficiency of the machine 100.

Figure 5:
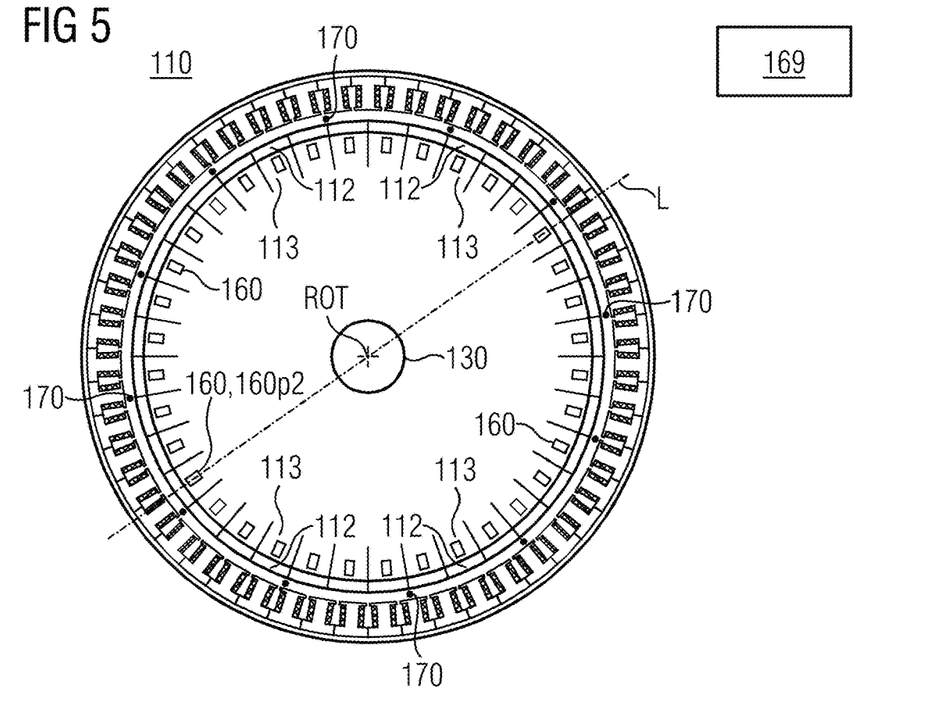
FIG. 5 shows an electric machine having a first arrangement of movement devices.

In another option for the use of the movement devices 160, which is explained with reference to FIG. 5, and in which the sensing mode and the actuating mode are combined, the current actual rotational position of the rotor 110 relative to the stator 120 is determined in the sensing mode, as described above. For this purpose, it may be sufficient if the rotational position is determined only from one of the multiplicity of movement devices 160. It is also possible to use several or even all of the movement devices 160 to determine the rotational position. At the same time, the local air gap widths are determined at several locations in the air gap 150 by measuring the respective magnetic flux densities B prevailing there with the aid of Hall-effect sensors 170, as indicated above, for example. From these, it is possible to infer the actual air gap width at the location of the respective Hall-effect sensor 170 (e.g., by determining an envelope curve of the measured magnetic field and, from this, then determining the maximum thereof).

The actual rotational position of the rotor and the actual air gap widths determined in this way, which are thus known for the locations of the Hall-effect sensors 170, are used for closed-loop air gap control in the control unit 169. In the process, it is possible to define the electric voltages with which the movement devices 160 are to be supplied in order to selectively set air gap widths. For this purpose, the system then operates consistently in the above-described actuating mode and sets the radial positions of the permanent magnets 112 and/or tooth heads 122k provided with movement devices 160. This may be detected by the Hall-effect sensors 170. As a result, closed-loop control of the air gap width is achieved.

Figure 6:
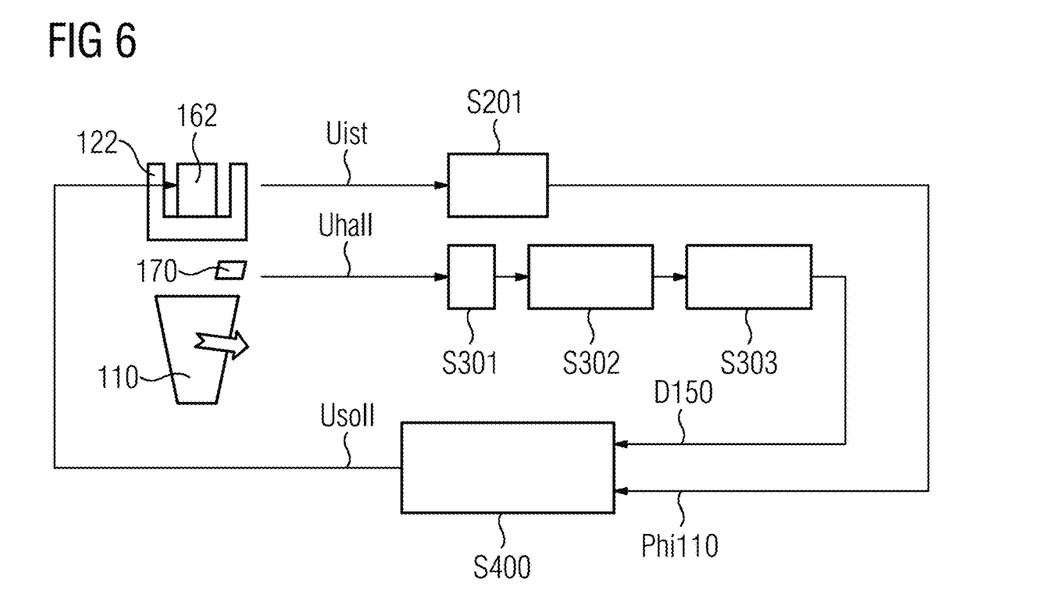
FIG. 6 shows a schematic illustration of an open-loop/closed-loop control of an air gap width.

The basic principle of this mode of operation is illustrated briefly in a schematic way in FIG. 6, where the one movement device 160 shown in this illustration is arranged in the stator tooth 122 on the stator 120, by way of example, and not in the rotor 110. In this case, the piezoelectric stack 162 delivers an actual voltage Uist, from which the rotational position of the rotor Phil 10 is determined in a process act S201, as described in conjunction with FIG. 4. The Hall-effect sensor 170 measures a measured value Uhall, by which a magnetic flux density is determined in act S201. From this, an envelope curve and, for example, the maximum thereof are determined in act S202, and, finally, the air gap width D150 at the location of the Hall-effect sensor 170 is determined in act S303. Finally, in act S400, using the measured values D150 and Phil 10, a setpoint voltage Usoll is calculated for the piezoelectric stack in order to set the air gap width as desired.

Although the use of the rotational position of the rotor Phil 10 is not absolutely necessary for this purpose, it is advantageous because it is thereby possible to achieve feedforward control of the closed-loop control process.

Another use in which the sensing mode is combined with the actuating mode consists in the damping of radial oscillations or vibrations of the rotor 110 that may occur. These may occur at certain speeds of rotation of the rotor 110, for example, and may lead to damage of parts of the machine 100. The movement devices 160 may then be used as active elements for reducing the oscillations.

In a first act, in the sensing mode, any oscillation of the rotor 110 relative to the stator 120 is detected. For this purpose, the methods described above may be employed (e.g., the Hall-effect sensors 170 and/or the movement devices 160 themselves), at which in this case voltages are picked off, in order to infer the air gap width.

The time behavior D150(t) of the air gap width D150 is then monitored with the aid of the control unit 169. Oscillations of the rotor 110 are reflected in a corresponding behavior of the air gap width D150 and hence in the time signal D150(t) and are thus relatively easy to identify. When an oscillation occurs, the movement devices 160 that are situated opposite one another relative to the axis of rotation ROT of the rotor 110 and the imaginary connecting line L of which is parallel to the direction of the oscillation, are regarded as a pair 160p1, 160p2 and operated in a manner matched to one another. This is indicated in FIG. 5. In this case, the movement device 160p1 at which the air gap 150 is wider or broader than expected or specified is operated such that the corresponding magnetic device 112 is moved toward the rotor 110, and the air gap width D150 at this location is correspondingly reduced. At the same time, the opposite movement device 160p2 is operated in the reverse manner and is quickly retracted or moved away from the rotor 110.

In this case, the above-described matched operation of the pair 160p1, 160p2 may ultimately even revolve with the oscillation if the direction of oscillation thereof is not constant but rotates around the axis of rotation. In other words, at various points in time, different movement devices 160 may form a respective pair, depending on the orientation of the direction of oscillation.

Ideally, not only are the two movement devices 160p1, 160p2 operated in a manner matched to one another in this way but also, in addition, a certain number of movement devices 160 arranged adjacent to these movement devices 160p1, 160p2.

If the typical switchover and response times of piezoelectric elements 161 are considered at an order of magnitude of 0.1 ms as compared with typical speeds of rotation of a rotor 110 at an order of magnitude of about 6000 revolutions per minute or 100 revolutions per second or corresponding revolution periods of 10 ms, it is found that a very rapid response to oscillations of the rotor 110 is possible owing to the relatively short response times of the piezoelectric elements 161. The revolving matched operation is also, for example, readily possible based on the ratios of the possible switchover times of the piezoelectric elements 161 in comparison with the speed of rotation.

In FIGS. 2 and 3, just one movement device 160 is illustrated in each case to clarify the general concept for the stator 120 and the rotor 110. However, it may be assumed that, in extreme cases, the illustrated configuration is the one that is applicable in order to achieve the best possible angular resolution for all the permanent magnets 112 of the rotor 110 and/or for all the teeth 122 and windings 121 of the stator 120. This has already been illustrated in FIG. 5 with reference to the example of the rotor 110.

Figure 7:
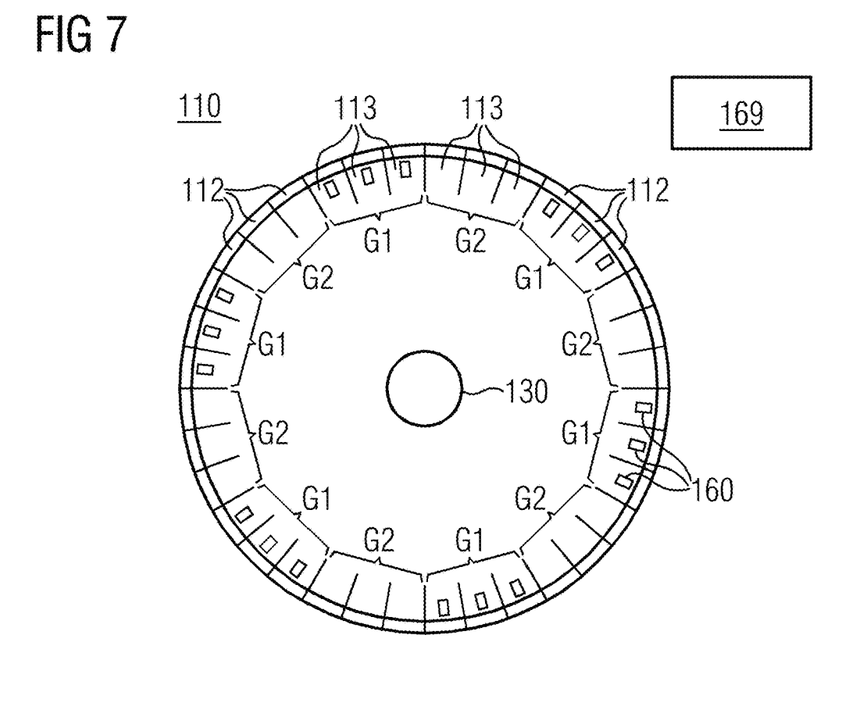
FIG. 7 shows an electric machine having a second arrangement of movement devices.

In a less complex design, movement devices 160 of this kind may not be provided for all the magnetic devices 112 or 121 of the rotor 110 or stator 120; instead, movement devices 160 may be provided only for each second magnetic device 112 or 121, for example, when viewed in the respective circumferential direction. In general, it may also be possible for groups G1, G2 of magnetic devices 112 or groups of magnetic devices 121 to be formed, where, for example, the magnetic devices 112 or 121 of a first type of group G1 are provided with movement devices 160, and the magnetic devices 112 or 121 of a second type of group G2 do not have any movement devices. This is illustrated once again by way of example for the rotor 110 in FIG. 7, where the illustration in FIG. 7 should be understood merely as a basic illustration and visualization of the concept of the arrangement in groups G1, G2 with and without a movement device 160. The corresponding groups G1, G2 are arranged alternately in series when viewed in the respective circumferential direction. Rhe various groups G1, G2 may be equal numbers, nG1=nG2, or, alternatively, unequal numbers, nG1≠nG2, of magnetic devices 112 or 121. In FIG. 7, it is assumed, for example, that each of the two groups G1, G2 includes three magnetic devices 112 (e.g., nG1=nG2=3). For the configuration mentioned, in which, for example, a movement device is provided only for every second magnetic device 112 or 121, nG1=nG2=1 would apply. In general, nG1≥1 and nG2≥0, where, ultimately, nG2=0 describes the design in FIG. 5.

Figure 8:
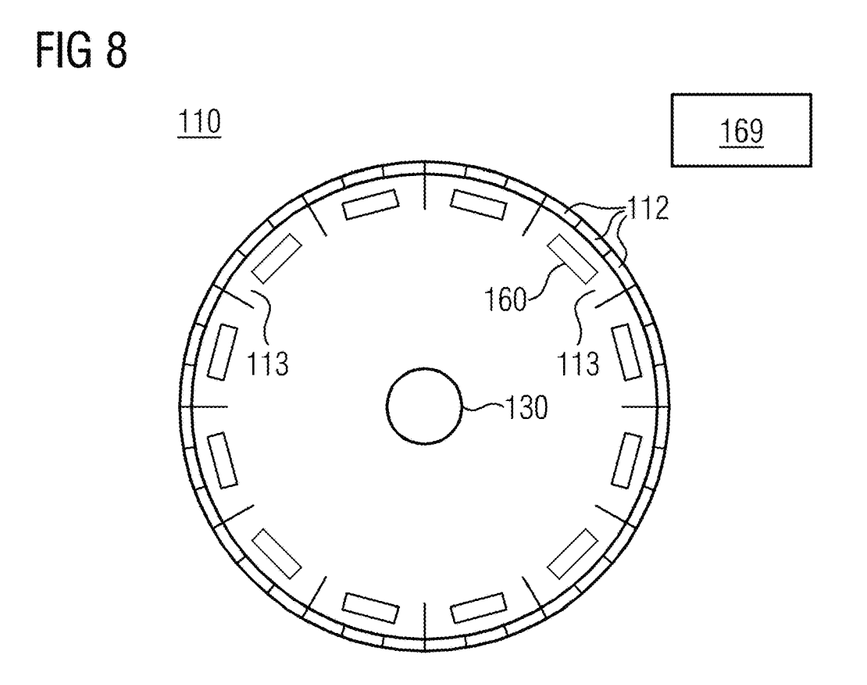
FIG. 8 shows an electric machine having a third arrangement of movement devices.

In one embodiment, a plurality of magnetic devices 112 or 121 may be movable jointly by a single movement device 160 (e.g., one movement device 160 is associated with a plurality of permanent magnets 112). This is illustrated in FIG. 8, where, by way of example, one movement device 160 in each case acts on three permanent magnets 112.

In the embodiments explained here, the movement devices 160 each have a piezoelectric stack 162 constructed from one or more piezoelectric elements 161. The use of piezoelectric elements 161 is advantageous inasmuch as, as is known, the piezoelectric elements 161 may develop a rapid and large force effect while being of compact construction. However, the movement devices 160 may employ other effects to bring about the radial movement. With regard to the two specific embodiments of the movement devices that are illustrated in FIGS. 2 and 3 as well, these are to be understood purely by way of example; it is also possible to use other arrangements by which, for example, radial forces that act such that, in the actuating mode, the desired movements may be achieved and/or, in the sensing mode, the data described may be obtained are produced.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An electric machine comprising:
a first cylindrical component having a first magnetic device and a second cylindrical component having a second magnetic device, wherein the first cylindrical component and the second cylindrical component are arranged concentrically with one another such that an air gap is formed between the first magnetic device and the second magnetic device,
wherein movement devices controllable by a controller are provided on at least one component of the first cylindrical component and the second cylindrical component, the movement devices being arranged such that, in a manner distributed along a circumferential direction of the respective component, in an actuating operating mode, the radial air gap width is influenceable selectively in an angularly resolved manner by the movement devices.

2. The electric machine of claim 1, wherein each of the movement devices is associated with one group of the first magnetic device and the second magnetic device of the at least one component equipped with the movement devices,
wherein a respective group comprises at least one magnetic device of the first magnetic device and the second magnetic device,
wherein each of the movement devices is arranged such that, on the at least one component, the respective movement device is actable on the group associated with the respective movement device, thus enabling a radial position thereof to be selectively influenced.

3. The electric machine of claim 1, wherein one component of the first cylindrical component and the second cylindrical component equipped with movement devices is a rotor of the electric machine, another component of the first cylindrical component and the second cylindrical component equipped with movement devices is a stator of the electric machine.

4. The electric machine of claim 3, wherein, on a circumference facing the stator, the rotor has magnet poles with receiving regions for the magnetic device of the rotor,
wherein, in the case where the rotor is equipped with movement devices:
at least some of the magnet poles have a cavity that is arranged below the respective receiving region when viewed in a radial direction and in each of which one of the movement devices is arranged such that, in the operating actuating mode, the one movement device is operable to influence the radial position of the respective receiving region, in each case by applying a force acting in the radial direction; or
at least some of the magnet poles have a movement device, wherein a respective movement device comprises an actuator and a force deflecting device and is arranged such that, in the operating actuating mode, the respective movement device applies a force acting in an axial direction, and the force deflecting device deflects an axial force into a radial force by which the radial position of the respective receiving region is influenceable.

5. The electric machine of claim 3, wherein the stator has, on a circumference facing the rotor, stator teeth that each have a tooth head facing the rotor, a tooth root facing away from the rotor, and a tooth neck arranged between the tooth head and the tooth root, and
wherein, in the case where the stator is equipped with movement devices, at least some of the stator teeth in each case have a cavity that is arranged in the region of the tooth neck and in each of which one of the movement devices is arranged such that, in the operating actuating mode, the one movement device is operable to influence the radial position of the respective tooth head, in each case by applying a force acting in the radial direction.

6. The electric machine of claim 1, wherein the controller is configured for an actuating mode in order to supply the movement devices selectively with electric signals in order to selectively set radial extensions of the movement devices to influence the radial air gap width.

7. The electric machine of claim 1, wherein the controller is configured for a sensing mode in order to operate the movement devices and, in the process, to pick off electric time signals at the movement devices and evaluate the electric time signals such that a rotational position of the rotor is determined therefrom, the radial air gap width is determined therefrom in an angularly resolved manner, or a combination thereof.

8. The electric machine of claim 7, wherein, for the angularly resolved determination of the radial air gap width, the electric machine further comprises a separate measuring device in addition or as an alternative to determination with the aid of the electric time signals that are pickable off at the movement devices.

9. The electric machine of claim 8, wherein the separate measuring device has a number of magnetic field sensors that are arranged in a manner distributed in the circumferential direction along the air gap for angularly resolved magnetic field measurement, and
wherein the controller is configured to determine the respective radial air gap widths at locations of the respective magnetic field sensors from magnetic fields measured by the magnetic field sensors.

10. The electric machine of claim 7, wherein the controller is configured to operate the movement devices such that, in an actuating mode, in the case where a state of deviation is detected during the angularly resolved determination of the radial air gap width, the state of deviation is counteracted, and a desired radial air gap width is achieved.

11. The electric machine of claim 7, wherein the controller is configured to use the determined rotational position of the rotor for general closed-loop, open-loop, or closed-loop and open-loop control of the electric machine.

12. The electric machine of claim 1, wherein the movement devices each have an actuator that comprises a piezoelectric stack comprising at least one piezoelectric element,
wherein the respective piezoelectric stack is connected electrically to the controller for the movement devices, and
wherein in the actuating operating mode, an extent of the actuator is settable based on an electric voltage applied by the controller, and in a sensing mode, an electric voltage dependent on an extent of the actuator is pickable off.

13. A method for operating an electric machine, the electric machine comprising a first cylindrical component having a first magnetic device and a second cylindrical component having a second magnetic device, wherein the first cylindrical component and the second cylindrical component are arranged concentrically with one another such that an air gap is formed between the first magnetic device and the second magnetic device, wherein movement devices controllable by a controller are provided on at least one component of the first cylindrical component and the second cylindrical component, the movement devices being arranged such that, in a manner distributed along a circumferential direction of the respective component, in an actuating operating mode, the radial air gap width is influenceable selectively in an angularly resolved manner by the movement devices, the method comprising:
selectively influencing the radial air gap width in an angle-dependent manner using the movement devices in the actuating operating mode.

14. The method of claim 13, further comprising:
picking off, in a sensing mode, electric time signals at the movement devices; and
determining a rotational position of the rotor from the picked off electric time signals.

15. The method of claim 13, wherein the radial air gap width is determined in an angularly resolved manner based on a number of measured values,
wherein at least some of the measured values are electric time signals picked off at the movement devices in a sensing mode, at least some of the measured values come from a separate measuring device that has a number of magnetic field sensors that are arranged in a manner distributed in the circumferential direction along the air gap for angularly resolved magnetic field measurement, or a combination thereof, and
wherein the measured values correspond to the magnetic fields measured by the magnetic field sensors.

16. The method of claim 13, wherein, in the case where a state of deviation is detected during the angularly resolved determination of the radial air gap width, the movement devices are operated such that, in an actuating mode, the state of deviation is counteracted, and a desired radial air gap width is achieved.

17. The method of claim 15, wherein the magnetic field sensors comprise Hall effect sensors.

18. The electric machine of claim 9, wherein the magnetic field sensors comprise Hall effect sensors.

19. An electric machine comprising:
a first cylindrical component having a first magnetic device and a second cylindrical component having a second magnetic device, wherein the first cylindrical component and the second cylindrical component are arranged concentrically with one another such that an air gap is formed between the first magnetic device and the second magnetic device,
wherein movement devices controllable by a controller are provided on at least one component of the first cylindrical component and the second cylindrical component, the movement devices being arranged such that, in a manner distributed along a circumferential direction of the respective component, in an actuating operating mode, the radial air gap width is influenceable selectively in an angularly resolved manner by the movement devices, and
wherein the controller is configured for an actuating mode in order to supply the movement devices selectively with electric signals in order to selectively set radial extensions of the movement devices to influence the radial air gap width.

* * * * *